(12) United States Patent
Lovelace

(10) Patent No.: US 6,477,685 B1
(45) Date of Patent: Nov. 5, 2002

(54) METHOD AND APPARATUS FOR YIELD AND FAILURE ANALYSIS IN THE MANUFACTURING OF SEMICONDUCTORS

(75) Inventor: Jerome R. Lovelace, McKinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 176 days.

(21) Appl. No.: 09/668,566

(22) Filed: Sep. 22, 2000

Related U.S. Application Data

(60) Provisional application No. 60/155,516, filed on Sep. 22, 1999.

(51) Int. Cl.[7] .............................................. G06F 17/50
(52) U.S. Cl. ............................................. 716/4; 716/19
(58) Field of Search ........................ 716/4, 5, 6, 18–21; 438/12, 1, 18

(56) References Cited

U.S. PATENT DOCUMENTS

| | | | |
|---|---|---|---|
| 5,240,866 A | | 8/1993 | Friedman et al. .............. 437/8 |
| 5,450,326 A | | 9/1995 | Black ........................ 364/468 |
| 5,598,452 A | * | 1/1997 | Takeno et al. ................ 378/71 |
| 5,646,432 A | * | 7/1997 | Iwaki et al. ................. 257/347 |
| 5,761,064 A | | 6/1998 | La et al. ..................... 364/468 |
| 5,828,778 A | | 10/1998 | Hagi et al. ................... 382/145 |
| 5,909,578 A | | 6/1999 | Buzbee ........................ 395/704 |
| 6,031,607 A | * | 2/2000 | Miyazaki ..................... 250/550 |
| 6,114,681 A | * | 9/2000 | Komatsu ..................... 250/201.3 |
| 6,122,397 A | * | 9/2000 | Lee et al. .................... 382/141 |
| 6,323,951 B1 | * | 11/2001 | Borden et al. ............... 356/502 |

* cited by examiner

Primary Examiner—Vuthe Siek
Assistant Examiner—Binh Tat
(74) Attorney, Agent, or Firm—April M. Mosby; W. James Brady; Frederick J. Telecky, Jr.

(57) ABSTRACT

A yield and failure analysis system having composite wafermaps provides the ability to view numerous lots on a single screen, identifying the semiconductor manufacturing process, which caused wafer failures and the associated malfunctioning equipment. A wafer inspection instrumentation (28) probes each wafer within a given lot and applies a series of tests. Wafer defect data is stored in a first relational database (46) for compiling a composite wafermap for each lot. Collected wafer defect data is converted into a FFT signature. Present wafer defect data is compared with stored converted wafer defect data patterns to generate correlation coefficients. When the correlation coefficients are within a predetermined range, the converted wafer defect data pattern is stored in the second relational database (47). Data may be accessed from both databases by a user interface (44), enabling the user to analyze data in real time and generate reports.

13 Claims, 11 Drawing Sheets

METHOD AND APPARATUS FOR YIELD AND FAILURE ANALYSIS IN THE MANUFACTURING OF SEMICONDUCTORS

FIELD OF THE INVENTION

This invention relates generally to the field of semiconductors; and, in particular, to a method for yield and failure analysis in the manufacturing of semiconductors.

BACKGROUND OF THE INVENTION

The process of fabricating an integrated circuit includes material preparation, circuit fabrication, wafer-probe testing, assembly, final testing and shipment. Initially a silicon ingot is cut to create individual wafers. This group of wafers are commonly referred to as a 'lot,' whereby each wafer is referred to by lot number, wafer number, resistivity, etc. Circuit fabrication may include several subsequent steps of diffusion, ion implantation, photolithography and plasma etch. The typical process step comprises the steps of deposition and growth of a thin film on the surface of the wafer, transferring the circuit pattern to a masking layer on the film, removing areas of the film not protected by the masking layer and doping exposed areas of the wafer. These steps may be repeated depending upon the process whether bipolar, MOS, CMOS or BiCMOS. Each one of these processes can produce a failure. Thus, once each individual circuit or die is complete, the purpose of wafer-probe testing, is to minimize packaging costs, and to gain information regarding process yields and final product performances.

Specifically, each die containing the completed devices and circuits are tested for basic operation, suitability for packaging, function and parametric performance. After testing, bad die are either physically marked or their locations recorded in an electronic data file. The good die are used to assemble the final device.

Although the level of automation differs from system to system, almost all wafer-probe systems are programmable. Test data is typically transmitted to a master computer database. The key components of a typical wafer-probe system include a microprocessor based controller, a tester module or subsystem, a probe card and a prober. One or more microprocessors control the tester module and prober as well as serve to provide data collection, storage and transmission. The tester module generates the input voltages, currents, and waveforms required to test the device. The tester module also measures voltages, currents and waveforms output from the device. The prober is the system component that actually handles the wafers. The prober moves the wafers in the x and y directions to align bonding pads of each die with the probe pin tips. It then raises the wafer to make contact with the probe tips and lowers the wafer after testing each die. The probe card is the printed circuit board or other assembly that holds the actual probe tips. The interface extending between the testing module and the probe include an interface board. The interface extending between the testing module and the prober is a cable interface.

The actual testing of the devices is software-driven in a sequence including continuity testing, functional testing, and parametric testing. Continuity testing is a very basic test to check whether a device turns on, if it is shorted, or if it has other fundamental flaws. Functional testing is a little more complicated than the continuity test. It tests whether the device works as a functional block. Parametric testing is the final and most complex test of the device this test checks for device performance within the given specifications. The data is stored in a management information system within the microprocessor based controller. The results of the tests and the selected sorting algorithm determine which bin the die is categorized by. The bin data is represented in a wafermap.

Finally, bad die are commonly marked by an ink dot. Inking may also be used to indicate other sorting data. The trend toward centralized data collection and storage includes computer mapping of die status. Individual die and wafer data can be averaged together to give information about the entire wafer fabrication process.

When analyzing the cause for failure of a die, the processes used to create the wafer and the equipment used to test each die must be taken into consideration. In manufacturing semiconductor wafers, thousands of wafer lots may be examined by a single piece of equipment. It is therefore essential that if a single piece of equipment is causing wafers to fail that it be repaired.

Processes such as photolithography, ion implantation, and plasma etch use specific equipment to complete the desired process. Several factors contribute to recognizing the exact failing process. The need to identify this process is crucial to manufacturing, quality control, and processing of subsequent wafers. There, however, exist no system available that identifies each and every aforementioned process wherein a fault lies, nor pinpoints the associated malfunctioning equipment. Thus, there exists a need for a system that identifies which process is causing the wafer to fail and determines the associated equipment. The need for identifying this process is crucial to manufacturing, quality control, and processing of subsequent wafers.

SUMMARY OF THE INVENTION

An automated wafer yield and failure analysis system identifies the particular semiconductor manufacturing process which cause wafer defective data is provided. The yield and failure analysis systems further identifies each and every aforementioned process wherein a fault lies and pinpoints the associated malfunctioning equipment. The given process is crucial to manufacturing, quality control, and processing of subsequent wafers.

The apparatus includes wafer inspection instrumentation whereby each wafer within a given lot is probed and a series of tests are applied. A data collection means, such as a computer having a central database system, collects wafer defect data from the wafer inspection instrument. The wafer defect data is in the form of x, y and z coordinates. This data is stored in a first relational database of the central database system. Accordingly, the first relational database compiles a composite wafermap for each lot. A conversion means such as software associated with the wafer inspection instrument applies Fast Fourier Transform equations to collected wafer defect data and converts this data into FFT signature data.

The converted wafer defect data is stored in a second relational database in the central database system wherein the stored converted wafer defect data patterns are retrievable based on selected criteria. Software may be used to compare the present wafer defect data with the stored converted wafer defect data patterns to generate correlation coefficients. Only if the correlation coefficients are within predetermined range, the converted wafer defect data pattern is stored in this second relational database. At least one user interface workstation displays data from both databases, allowing the user to select converted wafer defect data and analyzed data in real time.

In particular, the invention provides an apparatus and method of identifying the process associated with the die failure and, in particular, the invention provides a method of identifying a specific bin, piece of equipment, or even maintenance procedure. It includes probing the wafer to gain information regarding process yields and final product performances. Automating yield and failure analysis requires precision in order to account for all the information. Thus, the invention utilizes statistical and mathematical models to gather and examine the data. Data is compiled and updated for each wafer in a given lot to form a composite wafermap. This data is stored in a first database and accessible for continuous improvement of the yield and failure analysis apparatus.

Analyzing composite wafermaps is a very efficient and accurate method for recognizing failures on semiconductor wafers. By viewing these pass/fail patterns for numerous lots, the major problem can be easily identified, instead of having to step through each wafer. Accordingly, by providing the ability to view hundreds of lots and thousands of wafers on a single screen, the invention reduces the time needed to identify an error significantly. Thus, a broad range of applications as well as a wide array of analysis may be covered.

More particularly, according to the aforementioned embodiment of the present invention, the Fast Fourier Transform (FFT) of the signal generated from the wafer probe analysis yields a signature which serves to identify the type of wafer error that exists. The second relational database in a management information system within the computer is generated which includes all possible FFT patterns encountered during the manufacturing and testing of a wafer. By using a pattern recognition algorithm, specific process errors are recognized. A number of variables need are considered when determining the exact failing process.

The FFT signature is analyzed to determine the type of defect that exists. Comparison occurs between the FFT signature and those in the second relational database of patterns where previous wafermap patterns of electrical bin data is stored. In order to compare these patterns, the invention uses the FFT signature in matrix format and then generates a correlation coefficient for the given wafermap with each pattern. Through the use of a statistical tool that gives a numerical value of how close the match is between the patterns, the correlation coefficients are derived. Those patterns that meet a pre-defined criteria are stored in a third relational database.

Using the correlation coefficients, wafermaps are arranged in descending order such that, the highest correlation coefficient is listed first with its corresponding pattern. The invention automatically generates a pareto chart of the correlation coefficients, saving the user the trouble of identify the failing pattern that the wafermap corresponds to best.

An exceptions report indicates the necessary information to identify the exact problem. It includes the total number of defects encountered, which type of error is most significant, and the value of the correlation coefficient. The exceptions report can be prepared in a variety of different ways including sorting by yield, tracking over processes, overlay of maps, tracking over any range of time, viewing by volume of distribution, and composite maps for either a single key or numerous keys. Data is presented in an easy analyzable form, available for all the processes associated with the manufacturing of the semiconductor.

According to another embodiment of the failure and yield analysis management system, continuous improvement of the failure and yield analysis database is established. A first query of the first relational database is executed to generate a sub-database based upon user selection criteria. The user has the ability to zoom in and out on bin data, vary the statistical sensitivity, alter the segregation singularity, and generate pareto charts. From the resulting analysis, the system determines whether the new pattern generated should be included within the Patterns Database for future reference during in-line process testing, increasing failure and yield system reliability.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1:
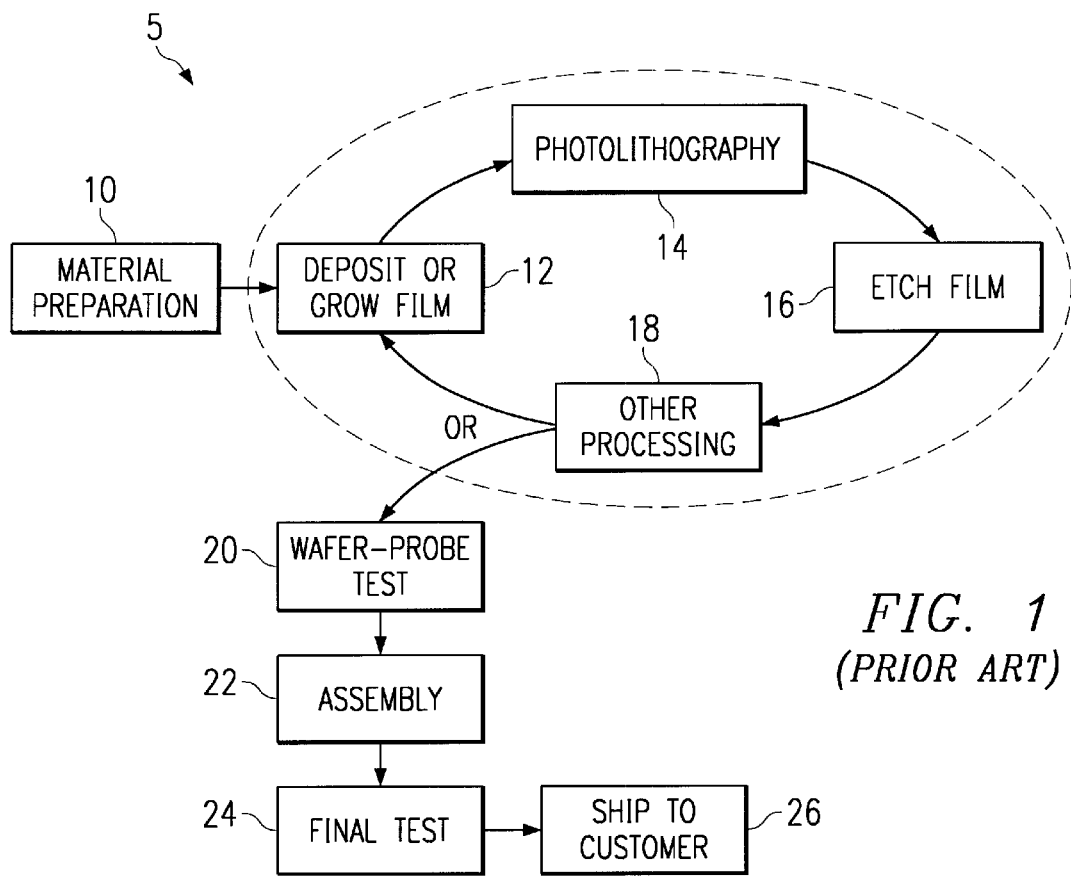
FIG. 1 is a prior art sequence of semiconductor manufacture processing.

The present invention provides an apparatus and a process for a failure and yield management tool, characterizing the defects on a semiconductor wafer in order to establish which, if any, process steps and failure modes gave rise to such defects. FIG. 1 illustrates a prior art flowchart of the process steps that typically occur in the manufacturing of semiconductors. In general the silicon wafer is prepared (step 10) and a film is deposited on the wafer (step 12). Any sequence of depositing of film, photolithography, film etch or other processing (steps 12, 14, 16 and 18) may occur. The cycle may be repeated many times depending upon the complexity of the device. The wafer probe testing (step 20) yields pass/fail results for each particular die. Once the die is assembled to package (step 22) and final testing has been performed (step 24), the completed product is shipped to the customer (step 26).

Figure 2A:
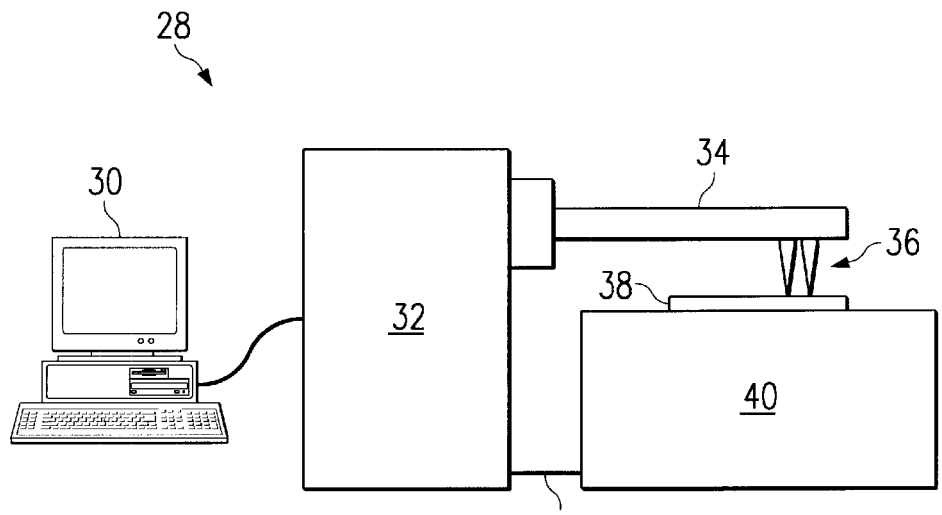
FIG. 2a is a prior art wafer probe test system.

FIG. 2a shows a prior art wafer testing apparatus 28 which includes a computer 30 which controls the tester 32 having a probe card 34 attached. The probes tips 36 connected to the probe card 34 make contact with the wafer 38 which sits upon the prober 40 connected to the tester 32 by a cable interface 42.

Figure 2B:
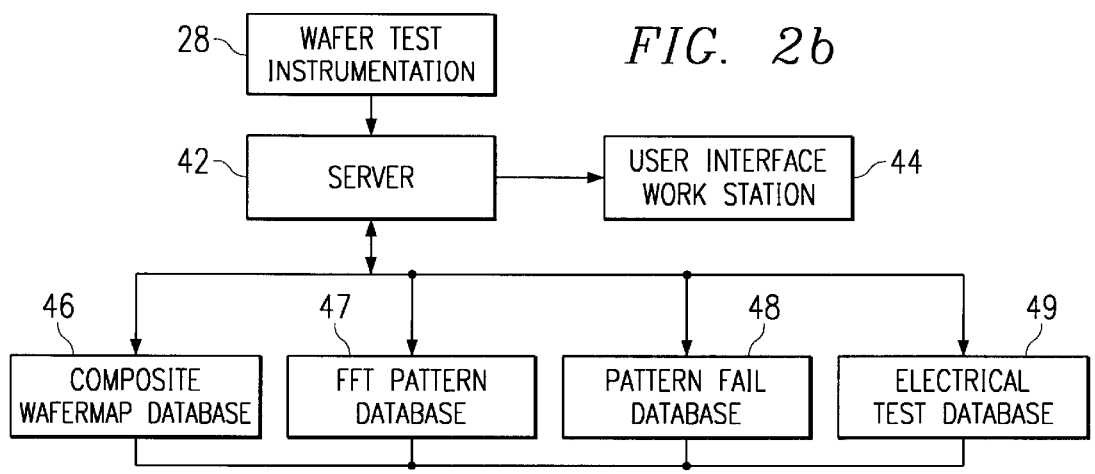
FIG. 2b is a block diagram of yield and failure analysis system in accordance with the present invention.

An embodiment of the yield and failure analysis system in accordance with the present invention shown in FIG. 2b includes the wafer inspection instrumentation 28 of FIG. 2. The apparatus includes wafer inspection instrumentation 28 whereby each wafer within a given lot is probed. A series of tests from an electrical test database 49 within a central database system are applied to each wafer within a given lot. A data collection means, such as a computer having a central database system, collects wafer defect data from the wafer inspection instrument. The wafer defect data is in the form of x, y and z coordinates. This data is stored in a first relational database of the central database system 46. Accordingly, the first relational database compiles a composite wafermap for each lot. Software associated with the wafer inspection instrument applies Fast Fourier Transform equations to the collected wafer defect data to convert this data into FFT signature data.

The converted wafer defect data is stored in a second relational database 47 in the central database system wherein the stored converted wafer defect data patterns are retrievable based on selected criteria. Software may be used to compare the present wafer defect data with the stored converted wafer defect data patterns to generate correlation coefficients. Only if the correlation coefficients are within predetermined range, the converted wafer defect data pattern is stored in a third relational database 48. At least one user interface workstation displays data from both databases, allowing the user to select converted wafer defect data and analyzed data in real time.

In particular, the invention provides an apparatus and method of identifying the process associated with the die failure and, in particular, the invention provides a method of identifying a specific bin, piece of equipment, or even maintenance procedure. It includes probing the wafer to gain information regarding process yields and final product performances. Automating yield and failure analysis requires precision in order to account for all the information. Thus, the invention utilizes statistical and mathematical models to gather and examine the data. Data is compiled and updated for each wafer in a given lot to form a composite wafermap. This data is stored in a first database and accessible for continuous improvement of the yield and failure analysis apparatus.

The yield management tool in accordance with the present invention operates using two modes. The first being a Process control method as shown in flowchart 50 of FIG. 3 where real-time analysis of wafer probing is conducted. The second being a continuous improvement method as shown in flowchart 150 of FIG. 5 where through the use of historical data, the databases within the system along with certain testing and analyzing parameters are modified to yield a more reliable failure and yield analysis tool. The method may be carried out automatically, as the method steps can be readily executed with the aid of a well-known computer. Moreover, the process can be executed on an interactive basis by a process engineer.

Figure 3:
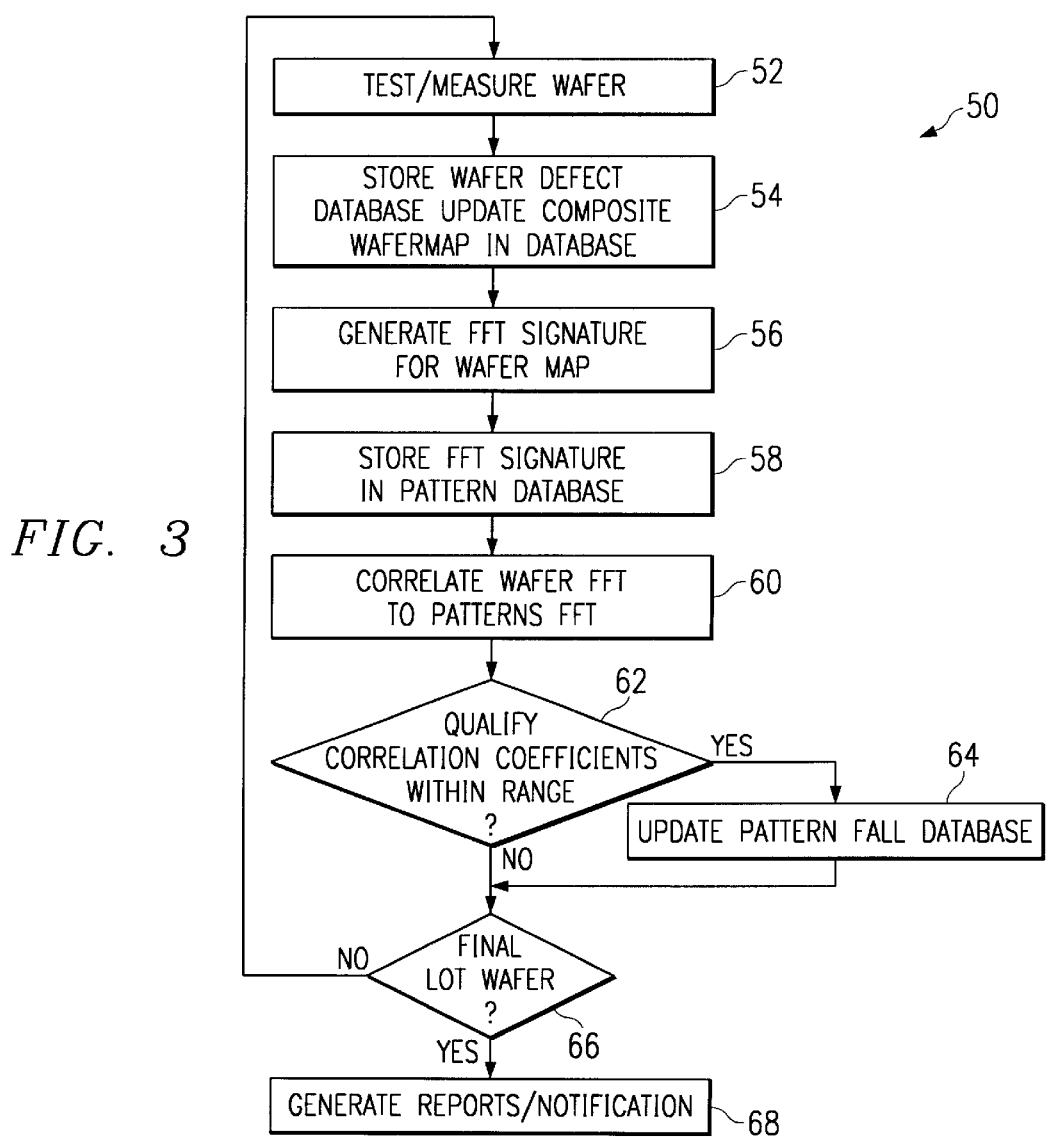
FIG. 3 is a flowchart of the process control method for the yield management tool in accordance present invention.

In FIG. 3, the Process Control flowchart 50 includes a first step, Step 52, which includes probing the wafer and retrieving electrical "bin" data. In addition, discreet measurements of the wafer may be measured as well, i.e., resistivity, thickness, particle quantity, or particle size. Each die has a particular x-y coordinate. After the wafer probe, the failure and yield apparatus retrieves wafer defect data in the form of x and y-coordinates, and z-yield data, where the yield data represents the contents of a bin. The bin data provides a count that the tester 32 of FIG. 2 uses to keep track of whether this particular die passes or fails each test. In the case of bin equals 'one', this means that the die at that particular x, y-coordinate passed all the tests, representing 100% yield. The keys define how user chooses to preselect or categorize the data. These parameters could be the bin number or a thickness measurement.

Specifically, electrical bin data may be represented by a '0', '1', '2', '3', . . . 'n'. The first value '0' corresponds to a short or no connection. The second value '1' corresponds to a good electrical chip. The third value '2' equates to a bad connection where the connection is either too resistive or shorted. The fourth value '3' means that the device is working but does not meet all the electrical requirements. Each value thereof up and through to an 'n'th value represents a particular resultant of the test applied.

Step 54 includes generating and updating a composite wafermap stored in a Composite Wafermap Database located within a central database system, such that the z-coordinate represents the sum of all the test results for all the wafers probed within the given lot thus far. Since each lot is processed by a particular piece of equipment, the data is categorized on a lot by lot basis, as opposed to categorization on a wafer by wafer basis. Thus, the composite wafermap comprises the sum of all defects on all wafers within a given lot.

Figure 8A:
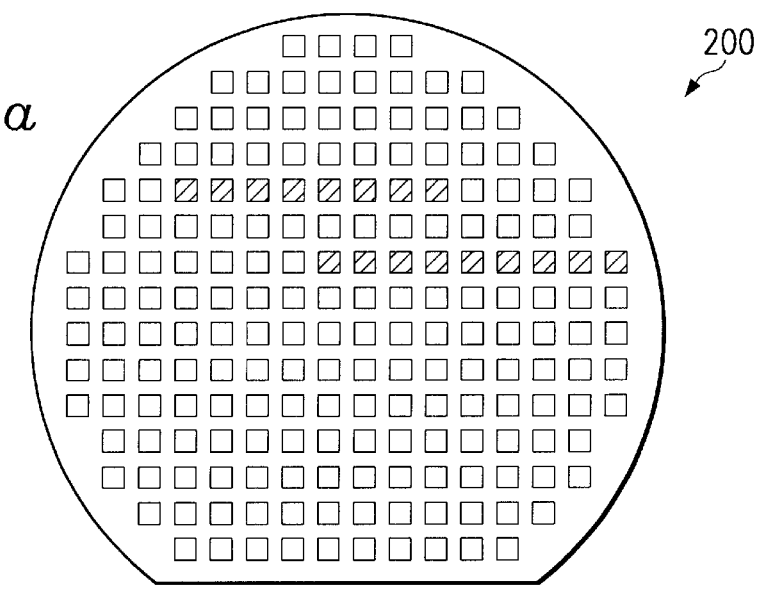
FIG. 8a is an illustration of a row error on a composite wafermap.
Figure 8B:
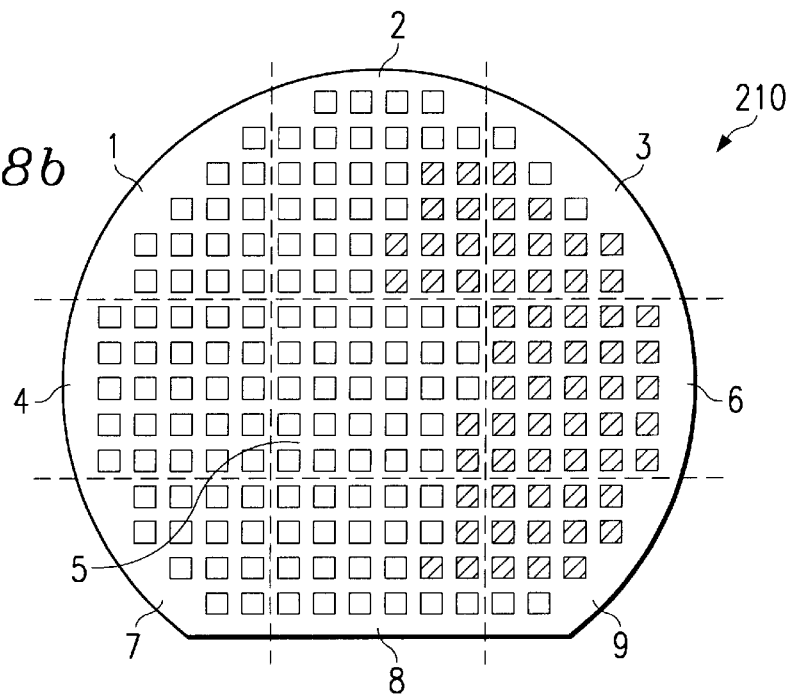
FIG. 8b is an illustration of a shade error on a composite wafermap.
Figure 9A:
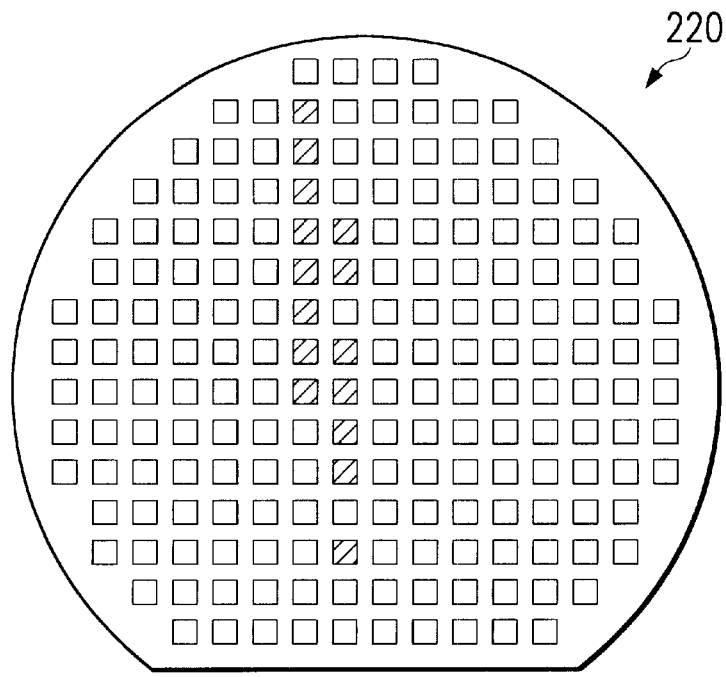
FIG. 9a is an illustration of a column error on a composite wafermap.
Figure 9B:
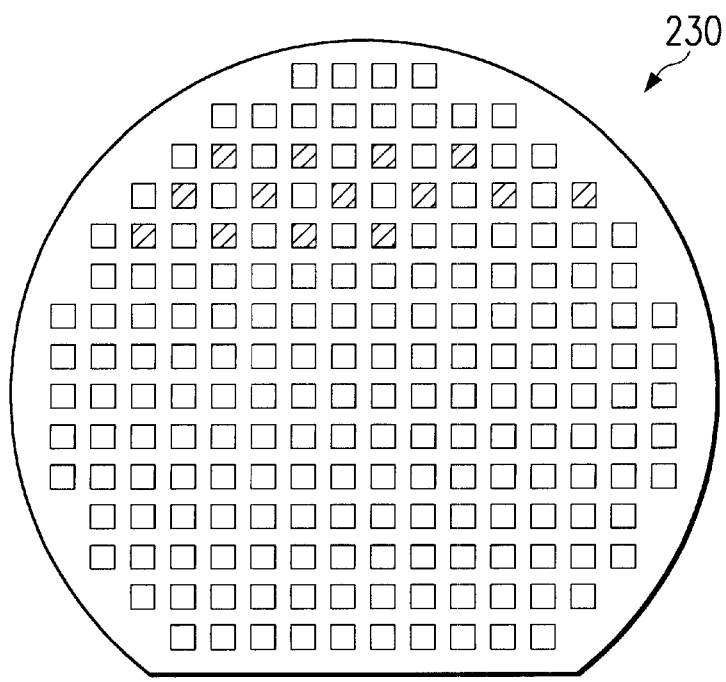
FIG. 9b is an illustration of a repetitive error on a composite wafermap.

A few of the types of composite wafermap patterns are indicated in FIGS. 8a, 8b, 9a, and 9b as a row error 200, shade error 210, column error 220, and a repetitive error 230, respectively. Shown in these FIGS. 8a, 8b, 9a, and 9b are resulting pattern maps of the wafers with binary 1's and 0's represented by the white and black areas, respectively. These types of errors refer to the type of pattern displayed on the wafermap. The column defect 220 indicates that the failure is concentrated on a vertical portion of the wafer, whereas, the row defect 200 indicates that the failure is concentrated on a horizontal portion of the wafer. The repetitive error 230 refers to a defect that displays a repeating pattern across the wafer, while the shade defect 210 indicates that the failure occupies one or more of nine sections of the wafer. The wafer is divided into nine regions as is shown in FIG. 8b. Thus, as displayed in FIG. 8b, the shade error has a defect in regions 2, 3, 5, 6, 8, and 9 with concentrated defects in regions 2, 3, 6, and 9. The row error of FIG. 8a has defects in regions 1–3. The column error of FIG. 9a has defects in regions 2, 5 and 8. The repetitive error of FIG. 9b has defects in regions 1–3.

During step 56, a Fast Fourier Transform signature is generated from the data retrieved in step 52. Through the use of the applicable parameter information such as bin data, the FFT signature is represented in the form of a complex matrix pattern having a real and an imaginary part. The flexibility provided with the use of matrix format ensures that matrices of all sizes can be manipulated. The conversion software routine normalizes or standardizes each matrix to a given predetermined dimension as selected by the user. The matrix for each wafer tested is in the same format as those stored patterns in the database that have been predefined for the particular wafer.

The following FFT equations are used to convert the wafer defect data into FFT signatures:

$$X(k+1) = \sum_{n=0}^{N-1} x(n+1) W_N^{kn} \quad (1)$$

$$x(n+1) = \frac{1}{N} \sum_{k=0}^{N-1} X(k+1) W_N^{-kn} \quad (2)$$

where the variables $W_N$ and N represent:

$$W_N = e^{-j(2\pi/N)} \quad (3)$$

$$N = \text{length}(x). \quad (4)$$

Equations (1) and (2) represent the transform (1) and the inverse transform (2) pair of equations, respectively. Specifically, the transform equation (1) is used for generating the pattern, and the inverse transform equation (2) is used for matching the patterns.

Figure 4:
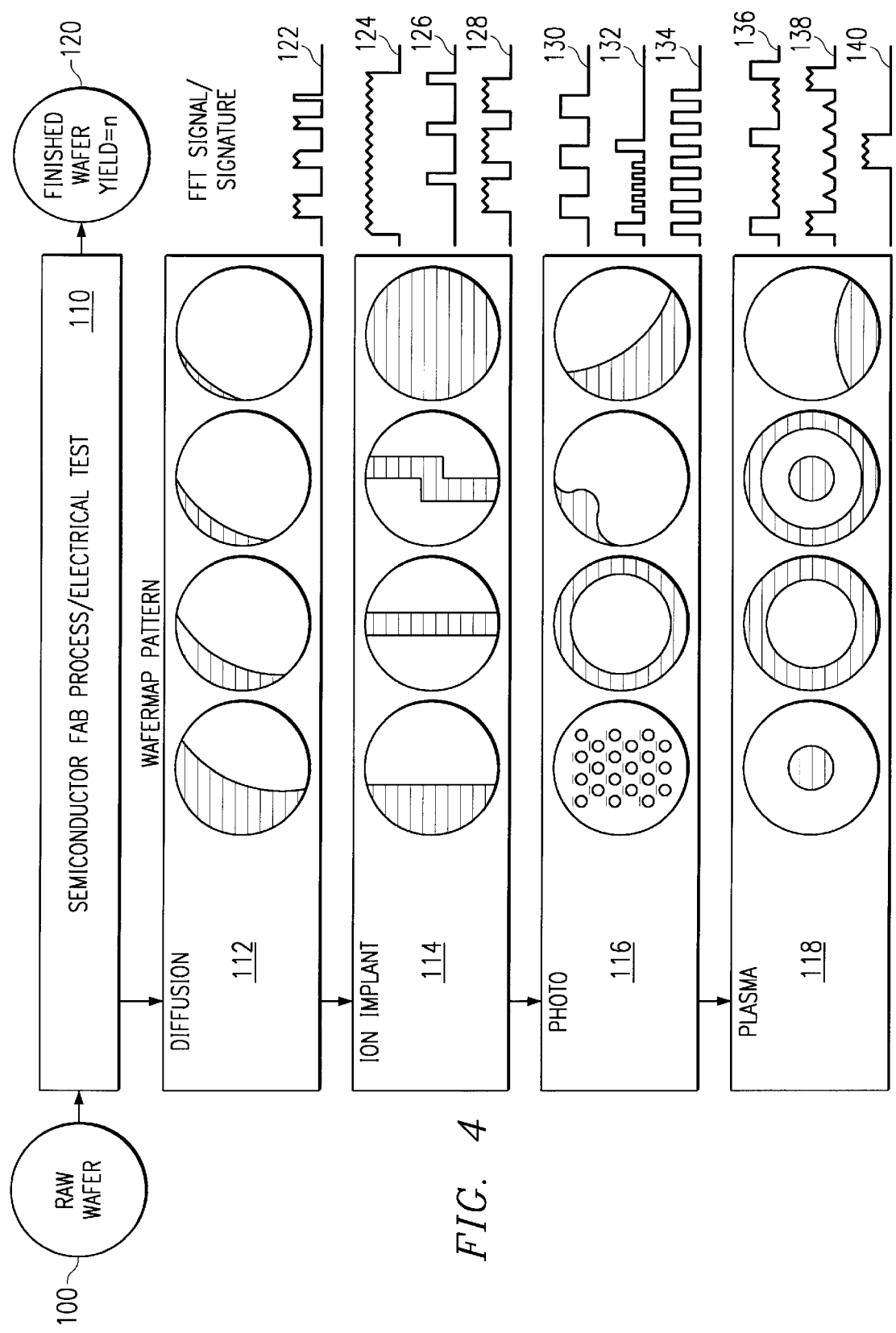
FIG. 4 is a block diagram of the sequence of semiconductor processing coupled with charts illustrating various defective composite wafermaps corresponding to different processes.

FIG. 4 is a block diagram and chart illustrating various composite wafermaps. The wafer 100 is processed through numerous semiconductor fabrication processing steps 110 to produce a finished wafer 120. As shown, the four processes: diffusion 112, ion implantation 114, photo-lithography 116, and plasma etch 118, each have characteristic defective composite wafermaps. From the composite wafer maps, FFT signatures 122, 124, 126, 128, 130, 132, 134, 136, 138, 140 are generated depending upon the process responsible for the error. The FFT signature is analyzed to determine which process generated the defective wafer.

Step 58 provides a storing of the FFT signature within a Pattern Database portion where the data generated from the previous step 56 is stored in the Pattern Database located within the central database system.

Step 60 includes correlating the single wafer FFT matrix to the pattern FFT matrix which may include all the particular patterns for the given device. Each pattern is compared to all other patterns stored for that particular device. The given wafermap of the specified device and lot number is compared with the stored patterns in the Pattern FFT database. Transform equation (1) computes the correlation coefficient. By utilizing the statistical tool of the correlation coefficient, an up-to-date tab is kept as the apparatus steps through each pattern. Each correlation coefficient is stored in a single array. This array containing the correlation coefficients is then sorted in descending order, where the element located in the first position of the array displays the pattern with the highest match.

Therefore, the apparatus may be used for any device, no matter how large or small its dimensions. Since the apparatus includes code that automates all of these procedures, the time necessary to analyze a wafer or a given lot is reduced compared to the time necessary to manually conduct failure and yield analysis. A tool such as MATLAB may be used to convert the data given by the lot number into binary format. The tool may simplify the necessary calculations.

Step 62 comprises qualifying the correlation coefficients obtained from step 60. In particular, a specific predetermined range is set whereby data within these limits are used to update a third database, a Pattern Fail Database located within the central database system. If the correlation coefficient is high enough for a match, this data is stored in a Pattern Fail database. The key deciding factor is the value of the correlation coefficient. Thus, a correlation coefficient threshold is needed to qualify your pattern matches. For example, where a comparison of the wafer to that pattern stored in the database has a best case correlation coefficient of 95% and a worst case correlation coefficient of 80%. A threshold between the range of 80% to 95% will be set so that not every single pattern that is mapped falls into the database.

In order to classify a failing wafer or lot into one of the four types of defects, some criteria must be used to separate them into their specific category. Thus, the apparatus uses threshold values, specific angle values and other numerical data to conduct this process. A specific threshold value exists for each of the four defect types for each device. This means that for two different devices the threshold value for the row defect could be 80% in one case and 30% in the other. These values have been determined by examining many lots for numerous devices and comparing the numerical data with existing pattern information to generate the correct threshold value. A specific angle value could also exist to distinguish between a column defect and a row defect. If the angle surpasses 45 degrees from the normal it becomes a column defect. Many limits of this sort may be incorporated to insure that the defect type the wafermap correlates to is the most precise match.

Assuming that the correlation coefficients are within the given range, step 64 which provides a pattern updating of the Pattern Fail Database portion. During this step 64, the Pattern Fail Database is updated relative the patterns that include failures, i. e. the specified lot and whether the defect is a either a row defect, column defect, shade defect or repetitive defect.

At step 66, it is determined whether the present wafer tested is the last in the lot. If the wafer is not the last with in the given lot, steps 52, 54, 56, 58, 60, 62, 64 and 66 are repeated until all wafers within the lot are tested.

Step 68 provides a generating report or notification report portion within the method in accordance with the present invention. A report or electronic notification may be generated base upon predetermined variables. This last step of the automating process includes displaying the data in a format that is easily read and interpreted by the user whereby the user is given the necessary information isolating the process problem.

The Exceptions Report also includes fields for the correlation coefficients for each defect type and the 'elapsed time'. The correlation coefficients allow the user to clearly see how the match was made. It also gives the user an idea of the required value needed to pass the threshold value. The elapsed time gives the user an indication of the speed of the analysis. Since the time needed to conduct this entire process is a mere fraction of a second, thousands of lots can be examined over a short period of time. By using the information given in the Exceptions Report, the user may conduct further analysis to correlate the defect type with an actual failing process or parameter.

Figure 5:
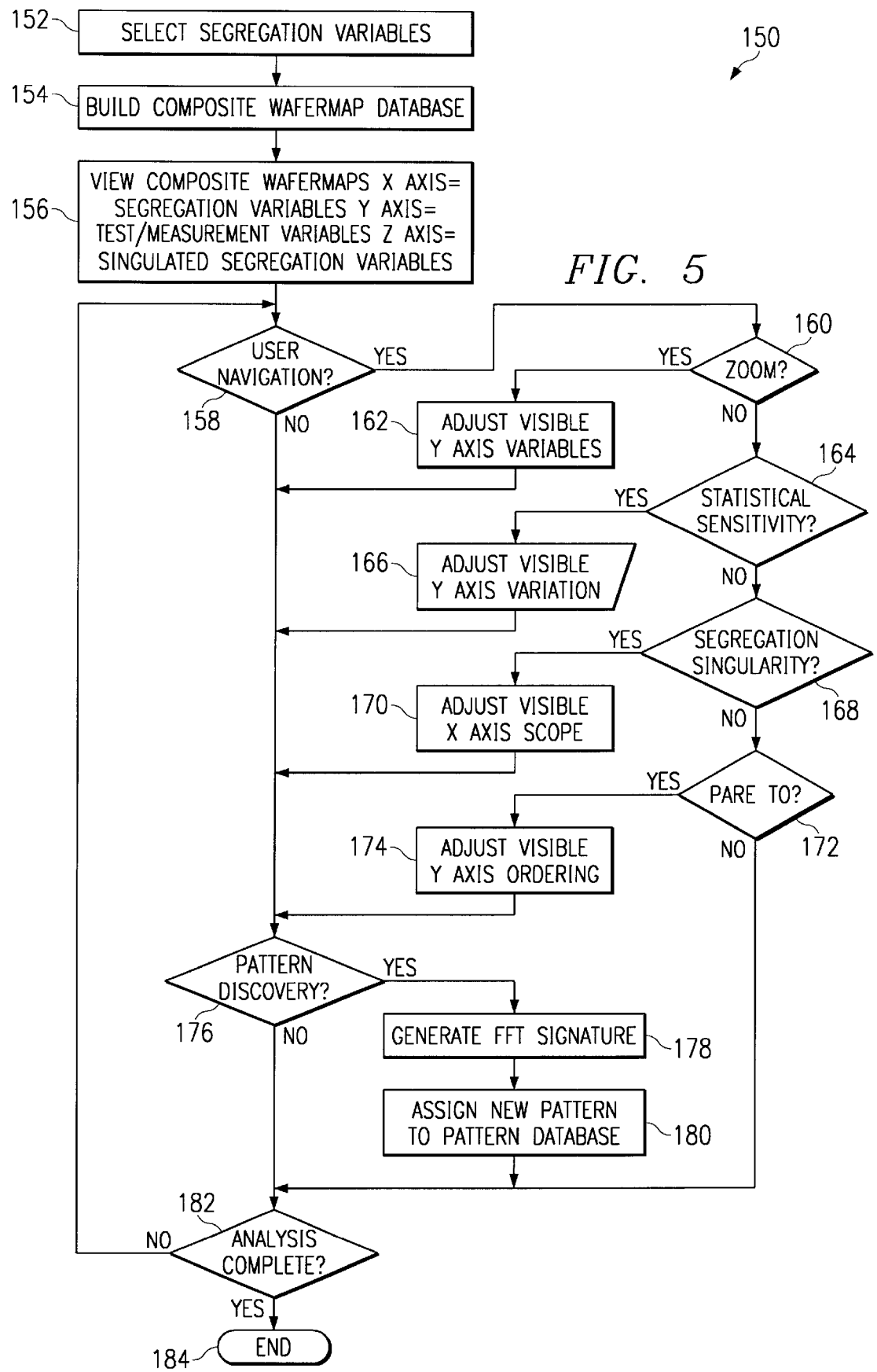
FIG. 5 is a flowchart of the continuous improvement method for the yield management tool in accordance present invention.

FIG. 5 illustrates the flow chart 150 for the Continuous Improvement method which includes retrieval of old data to streamline or improve a particular process. Step 152 includes selecting the segregation variables which define the categories or fields of a sub-database preferred by the user. For example, the user may choose to have the database defined with respect to time, equipment, operator, month, etc. This step 152 is entirely controlled by the user where the user has the freedom of picking any combination of parameters available. In essence, a database is generated based upon all the tests, parameters, and equipment used when processing a wafer. Accordingly, there are infinite combinations because a single key or any number above that can be displayed. The only restriction that is imposed is that the lot number must be given because that is the only criteria the invention uses to create the composite maps.

Figure 6A:
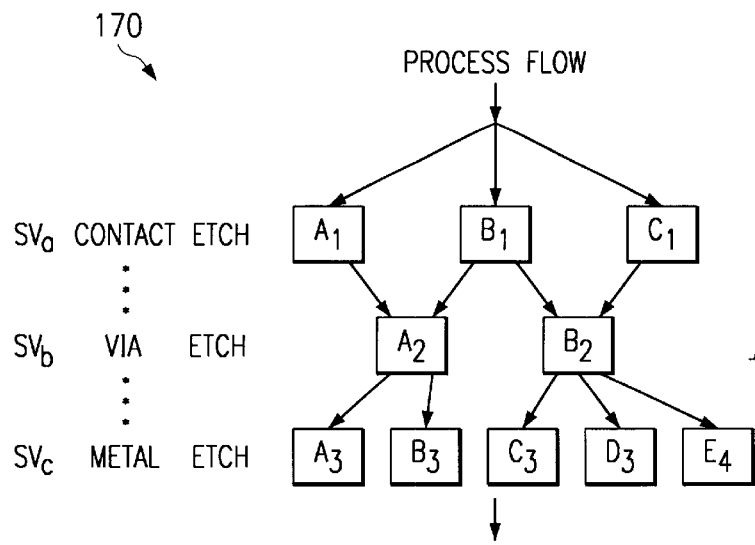
FIG. 6a is a process flow diagram of a semiconductor wafer fabrication.
Figure 6B:
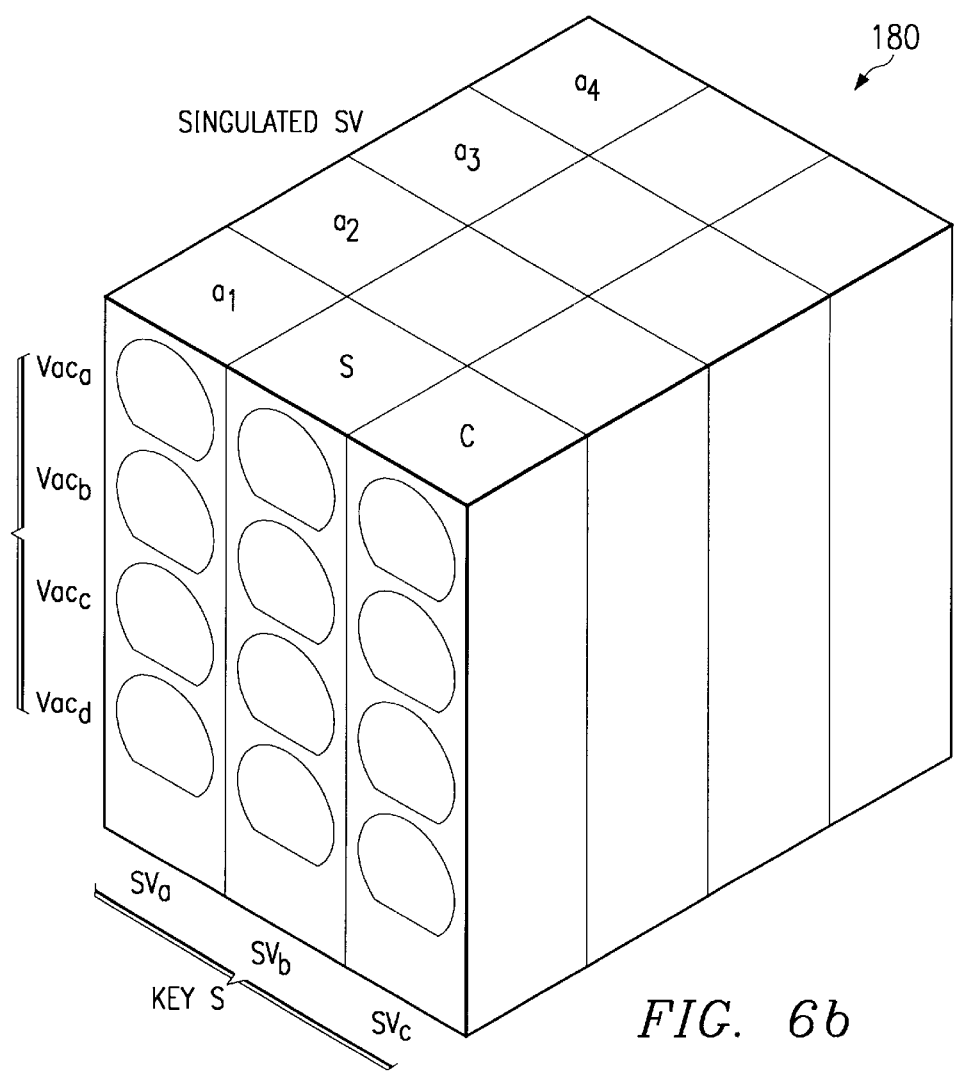
FIG. 6b is a graphical sketch of a Sub-Composite Wafermap Database.

FIG. 6a illustrates a semiconductor wafer fabrication process which includes three different instances of etch process steps: a contact etch, a via etch and metal etch. There are equipment associated with each process. As shown for the contact etch equipment $A_1$, $B_1$ and $C_1$ are used. Equipment $A_2$ and $B_2$ are used for the via etch process. Equipment $A_3$, $B_3$, $C_3$, $D_3$ and $E_3$ are used for the metal etch process step. Now referring back to step 152 of FIG. 5, the user may define a specific set of variables for the x, y and z-axis. According to step 154, building a Sub-Composite Wafermap Database such as the one represented in FIG. 6b is completed. As shown in FIG. 6b, the x-axis consists of values SVa, SVb and SVc, which correspond to the contact etch, via etch and metal etch steps respectively. The y-axis contains the values VALa, VALb, VALc, and VALd of the electrical bin data collected and stored in the Sub-Composite Wafermap Database. The z-axis will contain singulated segregation variables.

Step 156 generates the graphic image of the Sub-Composite Wafermap for user viewing. The database is displayed according to the chosen segregation variables.

Step 158 determines whether the user has decided to navigate the database variables. Features for the user includes zooming into the data, statistical sensitivity variation, segregation singularity, and pareto chart generation. Step 160 makes an inquiry into whether the user desires to zoom in or out, seeking a more focused analysis. A zoom-in and zoom-out function provides the user with the ability to review as many or as few bins as desired by the user; thus, similarities and differences can be examined throughout a single parameter key. If so, step 162 adjust the visible y-axis variables.

Figure 7:
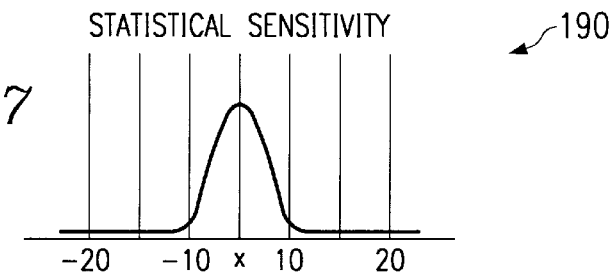
FIG. 7 is a statistical sensitivity chart for electrical bin data.

During step 164, the user may seeks to refine the statistical sensitivity. FIG. 7 shows the graph 190 of the statistical sensitivity range for the given lot. As shown, most statistical charts are bimodal or gaussian. The defaulted range reviewed extends from 2σ to −2σ. The user may chose to adjust this sensitivity range to any possible range. Depending on the reason the curve is being analyzed, the user may find it convenient to look at a portion of the curve that is pertinent to his application. The invention translates the data available in the distribution mode by creating a contour in the form of a wafermap. This contour can be a general or specific view of the distribution. Depending upon the needs of the user, the invention can display a concentrated view. For example, 10 percent of the distribution, which is the peak of the curve may be displayed. If a broad idea is needed, then the contour portrays the entire 100 percent, which is the entire curve. With this ability to look at any portion of the distribution, the user is able to obtain a better resolution of the problem. If the user desires to alter the portion of the curve analyzed, step 166 adjusts the visible y-axis range.

At step 168, the user may modify the segregation singularity. If user desires, step 170 adjusts the x-axis scope. In the alternative, during step 172, the user may place the y-axis in pareto chart format. If user so desires, step 174 adjusts the visible y-axis order.

Step 176 determines whether was a new pattern generated as a result of either of steps 40, 44, 48, and 52. If so, Step 178 converts the data into its FFT coordinates. This data in step 180 is stored into the Pattern Database associated with FIG. 3. At step 182, it is determined whether the analysis is complete. If so, the process is ended at step 184, otherwise, steps 158–182 are repeated.

Use of this type of analysis is necessary since a problem may reoccur. This reoccurrence could be due to a maintenance procedure, the changing of a piece of equipment or a mechanical failure. Without the ability to track the percent yield of lots over a long as well as short period of time, this could not be determined. The invention provides a precise method to do this because once the exact day, week, month, etc. is labeled as causing the error, the user simply has to look in the maintenance records or other records to identify what was done at that time to cause the problem.

Now that the problem has been narrowed to a specific time frame, the composite maps are used to identify the exact failing process. This is done by comparing the patterns of the maps for the bins to faulty maps that the user has encountered previously that are stored in the Pattern database. By matching the maps with one another, the problem can be identified.

Figure 10:
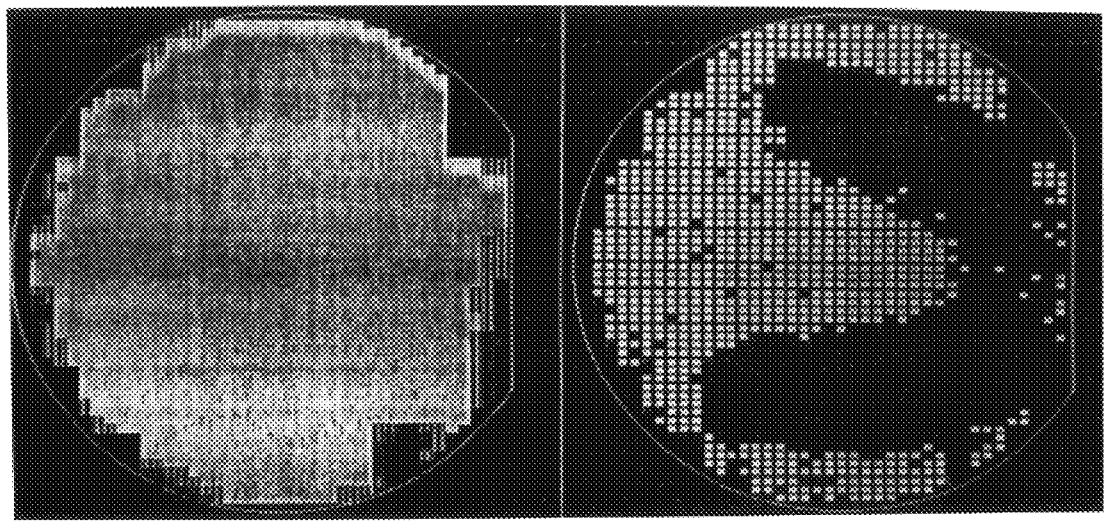
FIG. 10 is a view of the display of wafer defect data in accordance with the invention.

The data from the Composite Wafermap database may be feed into another analysis tool which has the ability to generate a graphical output such as that displayed in FIG. 10. Similarly, the numerical data contained within the Exceptions Report in FIG. 13 correlates to the graphical output that is displayed in FIG. 10. The numerical data from the Exceptions Report, however, provides a more precise analysis because it gives the exact number and type of failure with the corresponding correlation coefficient for each type of defect.

The example given in FIG. 10 displays a shade defect. The exceptions report in FIG. 13 indicates in addition that the error is also classified as a row, column, and repetitive defect. By simply pulling up the lot with the other analysis program, one has a visual confirmation of the defect. The Exceptions Report also gives which shades or areas of the wafer are defective through the 'Max Shades' parameter. The wafer is divided into nine regions, starting in the top left, proceeding horizontally across the wafer from left to right. Upon visual inspection of FIG. 10, regions 2, 6, 8 and 9 are clearly indicated as defective. This is verified by the Exceptions Report where displaying the value of "1" for indicates a defective shade. After viewing several of these Reports with their corresponding wafermaps, the user can simply visualize and identify the error by looking at the numerical data eliminating unnecessary time wasted examining irrelevant lots and wafers.

Figure 11:
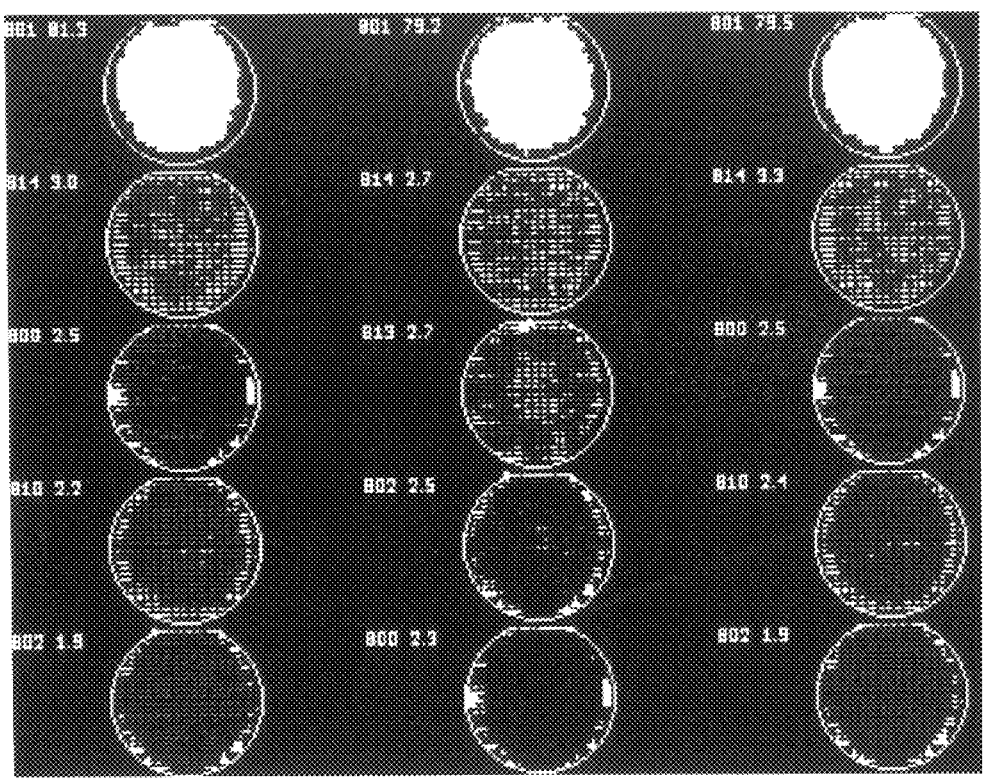
FIG. 11 is a view of the display of the sub-composite wafer defect data database in accordance with the invention.

FIG. 11 displays wafermaps for each bin for four different processes. It takes all the lots that were utilized in each process and displays the composite map for each bin for all of these lots. Specifically, the procedures relate to etching on the wafer. Associated with each of theses four keys are several more. The invention automatically groups the data using the lot number. To view the rest of the data, the user simply has to scroll to the desired key. Then all the data associated with a single key can be viewed. Therefore, the amount of data the viewer wishes to utilize for even a single process is only limited by the number of lots tested.

In order to assure an accurate method of failure and yield analysis, the invention shows exactly how many lots and wafers are being used to compile the data. The data is then compiled using addition of matrices to form a contour across all the wafers in all the lots. The use of different colors aids in visual recognition of pass/fail patterns. These features make it a sensitive and precise tool that can be implemented to analyze multitudes of information.

Figure 12:
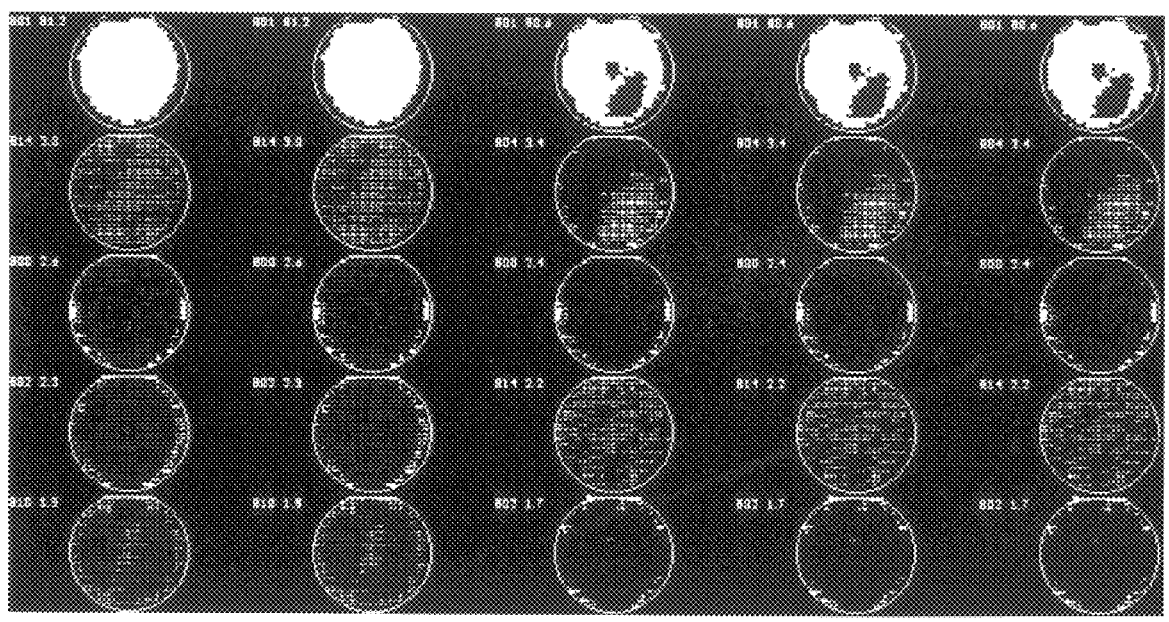
FIG. 12 is another view of the display of the sub-composite wafer defect data database in accordance with the invention.

FIG. 12 demonstrates a display of the composite wafer maps for various processes conducted over a two year span. The method of the present invention enables tracking over time that correspond to keys that have been chosen for testing and analysis. The parameters are listed in accordance with time. Shown the yearly composite maps corresponding to the keys selected is listed first. Next the quarter, monthly, weekly and daily composite maps are shown.

Figure 13:
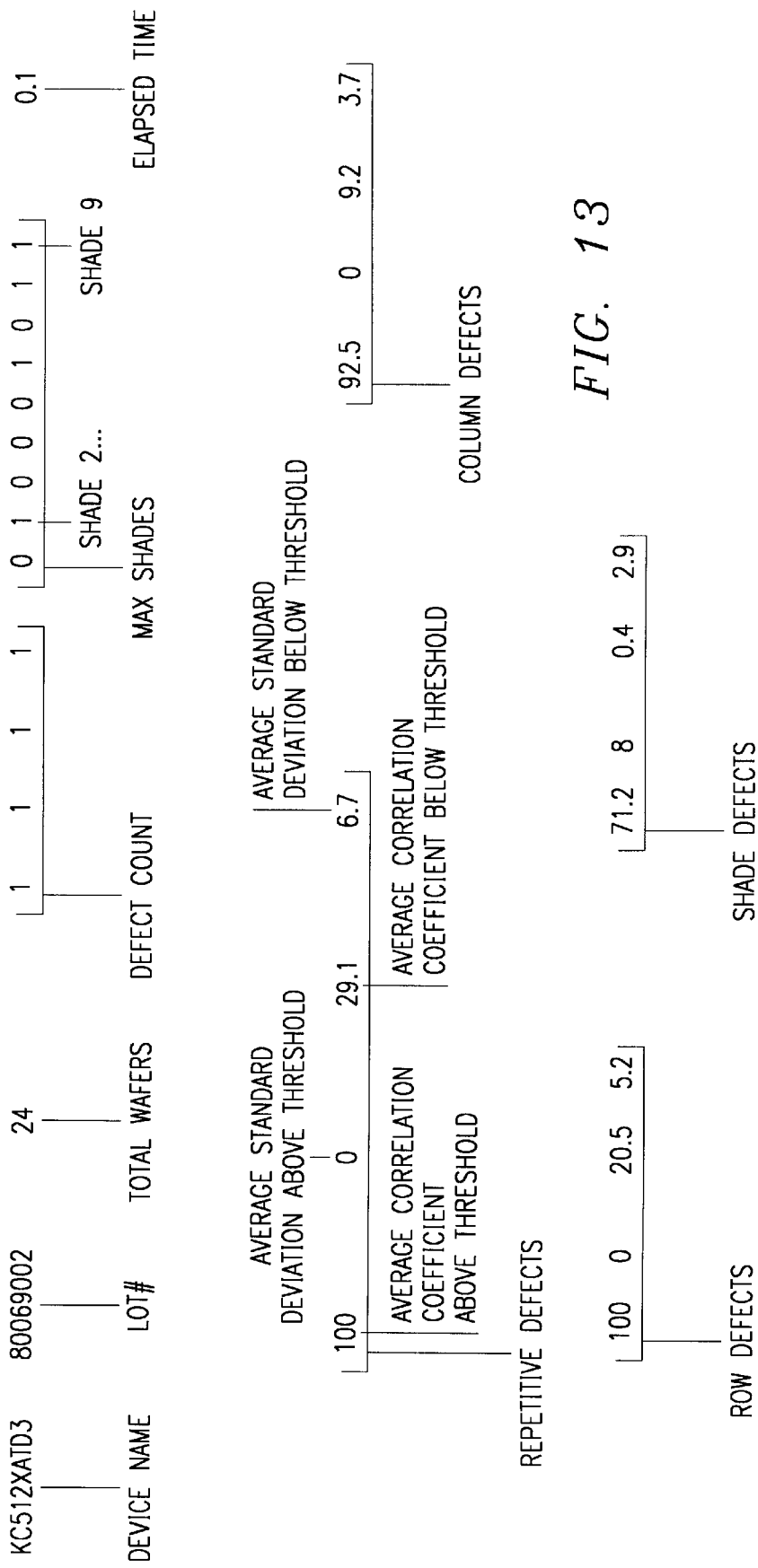
FIG. 13 is an exceptions report.

FIG. 13 illustrates an example of a type of report that can be generated from the flow chart displayed in FIG. 3. This exceptions report includes whether the wafermap error is either a shade defect, a row, column or repetitive defect. This report can be used in conjunction with the graphical display as shown in FIGS. 11 and 12 to confirm the defect. The wafer is divided into nine regions as is shown in FIGS. 8b. Reviewing the numerical data, the user is enabled to speed up the recognition time and save excess time examining unrelated wafers and lots.

It is to be understood that the above-described embodiments are merely illustrative of the principles of the invention. Various modifications and changes may be made thereto by those skilled in the art which will embody the principles of the invention and fall within the spirit and scope thereof.

APPENDIX

```
/* correlation of templates with each wafer in specified lot using 2d fft */
#include <stdio.h>
#include <math.h>
#include <dos.h>
#include <dir.h>
#include <mem.h>
#include <string.h>
#include <time.h>
#define VERSION "waferpat v19.0 by JEROME LOVELACE"
#define MAXWAFERS 50
#define MAXDEFECTS 4
#define MAXSHADES 9
#define SHADEINDEX 3
#define DIMENSIONS 2
#define YSIZE 64
#define XSIZE 128
#define ASIZE 8192
typedef unsigned char byte;
struct {
    byte total;
    byte defect[MAXDEFECTS];
    byte shade[MAXSHADES];
} wafer_data[MAXWAFERS+1];
struct {
    long size;
    char name[12];
    int wafer;
} file[MAXWAFERS];
union {
    float a[YSIZE] [XSIZE];
    float b[ASIZE];
    float c[4] [YSIZE/2] [XSIZE/2];
} data;
struct time start_time,new_time;
float sump[MAXDEFECTS],sumsqrp[MAXDEFECTS],sumf[MAXDEFECTS],sumsqrf[MAXDEFECTS],
        cc[15],cfunc( ),process_time,th,total_et,process_end( );
char lot[40],output[40],search[40],data_path[40],support_path[40],suse[80],
        device[20],config[50],d_type[14],d_ptr[40],dev_path[50];
int nrow,ncol,rep,col,row,shade,ALOOP,wafer,flat,defects[MAXDEFECTS],
        shades[MAXSHADES],nn[DIMENSIONS];
FILE *f_out;
FILE *f_real;
FILE *f_imag;
FILE *f_dev;
FILE *f_cfg;
/* main ***********************************************************************/
main(int argc,char *argv[ ])  {
    struct ffblk fileinfo;
    int count,i,done;
    long fsize;
    struct tm *ptr;
    time_t lt;
    int shadesort[MAXSHADES];
    _stklen=(unsigned)0x9fff;
    lt=time('\0');
    ptr=localtime(<);
    clrscr( );
    printf("%s\n\n",VERSION);
    printf("%-15s :\n%-15s :\n%-15s :\n%-15s :\n%-15s :\n%-15s :\n%-15s :\n%-15s :\n%-15s :\n",
                    "start","stop","lot","device","wafer(s) ","wafer","e/t     (sec)","e/t cum(min)", "process");
    gotoxy(19,3);
```

APPENDIX-continued

```
    printf("%s",asctime(ptr));
    if (argc==1)
        exitprogram(1,"NO COMMAND LINE PARAMETERS PASSED");
    if (argc<=4)
        exitprogram(1,"MISSING COMMAND LINE PARAMETER(S)");
    sprintf(data_path, "%s",argv[1]);
    sprintf(dev_path,"%s",argv[2]);
    sprintf(support_path,"%s",argv[3]);
    sprintf(output,"%s",argv[4]);
    if ((f_out=fopen(output,"a"))==NULL)
        exitprogram(1,"UNABLE TO OPEN OUTPUT FILE");
    getlothdr( );
    if ((f_dev=fopen(dev_path, "r"))==NULL)
        exitprogram(1,"UNABLE TO OPEN DEVICE LIST");
    while(1) {
        fscanf(f_dev,"%s%s",&d_type,&d_ptr);
        if (strncmp(d_type,device,strlen(d_type))==0) {
            strcat(support_path,d_ptr);
            fclose(f_dev);
            goto scan_end;
        }
        if (feof(f_dev))
            exitprogram(2,"DEVICE NOT IN LIST");
    }
scan_end:
    sprintf(config, "%s\\cfg", support_path);
    if ((f_cfg=fopen(config,"r"))==NULL)
    exitprogram(1,"UNABLE TO OPEN CONFIG FILE");
    fscanf(f_cfg,"%d%d%d%d%d",&nrow,&ncol,&rep,&col,&row);
    fclose(f_cfg);
    if (nrow>32 && ncol>32) {
        nn[0]=64;
        nn[1]=64;
        ALOOP=ASIZE;
    }
    else {
        nn[0]=32;
        nn[1]=32;
        ALOOP=ASIZE/4;
    }
    gotoxy(19,5);
    printf(data_path);
    gotoxy(19,6);
    printf("%-14s",device);
    sprintf(search,"%s*.bin", data_path);
    done=findfirst(search,&fileinfo,0);
    if (done) {
        fclose(f_out);
        exitprogram(1,"UNSUCCESSFUL FINDFIRST CALL");
    }
    count=0;
    fsize=0;
    memset(wafer_data,0,sizeof(wafer_data));
    while (!done) {
        sprintf(file[count].name,"%s",fileinfo.ff_name);
        i=atoi(strtok(fileinfo.ff_name,"."));
        if (i>0 && i<=MAXWAFERS) {
            wafer_data[i].total=1;
            file[count].size=fileinfo.ff_fsize;
            file[count].wafer=i;
            if (file[count].size>fsize)
                fsize=file[count].size;
            count++;
        }
        done=findnext(&fileinfo);
    }
    memset(defects,0,sizeof(defects));
    memset(shades,0,sizeof(shades));
    memset(sump,0,sizeof(sump));
    memset(sumsqrp,0,sizeof(sumsqrp));
    memset(sumf,0,sizeof(sumf));
    memset(sumsqrf,0,sizeof(sumsqrf));
    total_et=0.0;
    gotoxy(19,7);
    printf("%6d",count);
    for (i=0;i<count;i++) {
        gotoxy(19,8);
        printf("%6d",i+1);
        if (file[i].size==fsize) {
```

APPENDIX-continued

```
            process_start( );
            wafer=file[i].wafer;
            process("read wafer data");
            input(&file[i].name);
            process ("correlate");
            corr( );
            process("detect");
            detect( );
            process_time=process_end( );
            gotoxy(19,9);
            printf("%6.1f",process_time);
            total_et=total_et+process_time;
            gotoxy(19,10);
            printf("%6.1f",total_et/60.0);
        }
    }
    if (count>0) {
        fprintf(f_out,"\"%-8s\" %02d%02d%02d \"%-8s\" %3d",
                    device,ptr->tm_year,ptr->tm_mon,ptr->tm_mday,lot,count);
        for (done=0;done<MAXDEFECTS;done++)
            fprintf(f_out," %3d",defects[done]);
    }
    if (defects[SHADEINDEX]>0) {
        for (done=0;done<MAXSHADES;done++)
            fprintf(f_out," %3d",shades[done]);
    }
    fprintf(f_out," %6.1f",total_et/60.0);
    for (done=0;done<MAXDEFECTS;done++) {
        th=count-defects[done];
        if (done==3) {
            defects[done]=0;
            for (i=0;i<MAXSHADES;i++)
                defects[done]+=shades[i];
            th=(float)(count*MAXSHADES)-defects[done];
        }
        if (defects[done]>0) {
            sump[done]=sump[done]/defects[done];
            if (defects[done]>1) {
                sumsqrp[done]=sqrt(fabs((sumsqrp[done]-
(defects [done]*(sump[done]*sump[done])))/defects[done]-1));
            }
            else
                sumsqrp[done]=0.0;
        }
        else
            sump[done]=0.0;
        if (th>0) {
            sumf[done]=sumf[done]/th;
            if (th>1.0)
                sumsqrf[done]=sqrt(fabs((sumsqrf[done]-(th*(sumf[done]*sumf[done])))/th-1));
            else
                sumsqrf[done]=0.0;
        }
            fprintf(f_out," %5.1f %5.1f %5.1f %5.1f",
                    sump[done],sumsqrp[done],sumf[done],sumsqrf[done]);
    }
    fprintf(f_out,"\n");
    fclose(f_out);
    lt=time('\0');
    ptr=localtime(<);
    gotoxy(19,4);
    printf("%s",asctime(ptr));
    exitprogram(0,"analysis complete");
}
/* getlotdata -------------------------------------------------------------------------*/
getlothdr( )
{
    struct {
        char    lot[8];         /* probe lot# */
        char    pgm[8];         /* device pgm name */
        char    dev[14];        /* SMS device name*/
        long    lot_open_date;  /* opened date as yymmdd numeric*/
        int     lot_open_time;  /* opened time as hhmm numeric*/
        long    lot_close_date; /* closed date as yymmdd numeric*/
        int     lot_close_time; /* closed time as hhmm numeric*/
        long    tot_bin[32];    /* lot bin totals */
        long    tot_sc[32];     /* lot sort counter totals */
        int     tot_wafers;     /* count all of wafers for lot */
        long    tot_tested;     /* lot total tested*/
```

APPENDIX-continued

```
        int     theor_dpw;          /* theoretical die per wafer */
        long    lot_arc_date;       /* closed date as yymmdd numeric*/
        int     lot_arc_time;       /* closed time as hhmm numeric*/
        unsigned i[4];              /* scrapped wafers for QC reasons */
        unsigned j[4];              /* wafers actually probed */
        char    k[32];              /* last reprobe designation for wafer*/
        char    xmax, ymax, flat;   /* geometry info saved here */
        char    extra_bytes[5];     /* reserved (extra) */
    } lothdr;                       /* 368 bytes */
    sprintf(lot,"%slot",data_path);
    if ((f_dev=fopen(lot,"r+b"))==NULL)
        exitprogram(1,"UNABLE TO OPEN LOT FILE");
    fread(&lothdr,sizeof(lothdr),1,f_dev);
    strncpy(lot,lothdr.lot,8);
    strncpy(device,lothdr.dev,14);
    fclose(f_dev);
    device[14]='\0';
    flat=(int)lothdr.flat;
}
/* exitprogram--------------------------------------------------------------------------*/
exitprogram(c,s)
int c;
char s[ ];
{
    gotoxy(19,11);
    printf("%-61s\n",s);
    exit (c);
}
/* process--------------------------------------------------------------------------------*/
process (s)
char s[ ];
{
    gotoxy(19,11);
    printf("%-61s\n",s);
}
/* process_start-----------------------------------------------------------------------*/
process_start( ) {
    gettime(&start_time);
}
/* process_end------------------------------------------------------------------------*/
float
process_end( ) {
        float tmp1,tmp2,t;
        gettime(&new_time);
        tmp1 =start_time.ti_sec+(start_time.ti_hund/100.0);
        tmp2 = new_time.ti_sec+( new_time.ti_hund/100.0);
        if (tmp2<tmp1)
            tmp2+=60.0;
        t = tmp2-tmp1;
        return(t);
}
/* input-----------------------------------------------------------------------------------*/
input(char file[13]) {
    FILE *f_in ;
    struct {
        byte xstart,ystart,count;
    } loc;
    byte temp[64];
    int i,j,k,l,hsize=sizeof(loc);
    char path[80];
    sprintf(path,"%s%s",data_path,file);
    if ((f_in = fopen(path,"rb"))==NULL)
        exitprogram(1,"UNABLE TO OPEN INPUT FILE");
    memset(data.a,0,sizeof(data.a));
    while(1) {
        fread((char *)&loc,hsize,1,f_in);
        if (feof(f_in)) break;
        fread((char *)&temp,loc.count,1,f_in);
        i = loc.ystart;
        k = 2*loc.xstart;
        l = 0;
        process("switch1");
        switch (ALOOP) {
            case 2048 :  for (j=0;j<(2*loc.count);j=j+2) {
                             if (temp[1] !=1)
                                 data.c[0] [i] [j+k]=1.0;
                             l++;
                         }
                         break;
```

APPENDIX-continued

```
                case 8192 :    for (j=0;j<(2*loc.count);j=j+2) {
                                    if (temp[1] !=1)
                                        data.a[i] [j+k]=1.0;
                                    1++;
                                }
                                break;
            }
        }
        fclose(f_in);
}
/* corr------------------------------------------------------------------------------------*/
corr( ) {
        int i,j,k,l,m,divr,divc;
        float factor;
        char input[80];
        memset(cc,0,sizeof(cc));
        factor=pow((float)nn[0],2.0);
/* spatial shade correlation */
    divr=ceil (nrow/3);
    divc=ceil (ncol/3);
    m=0;
    shade=0;
    process("switch2");
    switch (ALOOP) {
        case 2048 :
                process("switch2a");
                for (i=0;i<=2;i=i++) {
                    for (j=0;j<=2;j=j++) {
                        for (k=(i*divr);k<((i+1)*divr);k++) {
                            for (1=(j*divc);1<((j+1)*divc);1++)
                                if (data.c[0] [k] [2*1]==1) cc[m]++;
                            }
                            m++
                        }
                    }
                    break;
        case 8192
                process("switch2b");
                for (i=0;i<=2;i=++) {
                    for (j=0;j<=2;j=j++) {
                        for (k=(i*divr);k<((i+1)*divr);k++) {
                            for (1=(j*divc);1<((j+1)*divc);1++)
                                if (data.a[k] [2*1]==1) cc[m]++;
                        }
                        m++;
                    }
                }
                break;
        }
    process("loop2");
    for (i=0;i<=8;i++) {
        cc[i]=cc[i]*(100.0/((float)(divr*divc)));
        if (cc[i] > 50) shade=1;
    }
/* fft of wafermap data */
    process("fft");
    fourn(data.b-1,nn-1,DIMENSIONS,1);
/* correlation between wafermap and templates */
/* correlation with repetitive template */
    process("correlate repetitive");
    sprintf(input,"%s%s",support_path,"\\rep.rb");
    if ((f_real=fopen(input,"r+b"))==NULL)
        goto error_corr;
    cc[9]=(cfunc( )/factor)*((float)(100.0/rep));
    fclose(f_real);
/* correlation with second column template */
    process("correlate column");
    sprintf(input,"%s%s",support_path,"\\col2.rb");
    if ((f_real=fopen(input,"r+b"))==NULL)
        goto error corr;
    cc[10]=(cfunc( )/factor)*((float)(100.0/col));
    fclose(f_real);
/* correlation with second row template */
    process("correlate row");
    sprintf(input,"%s%s",support_path,"\\row2.rb");
    if ((f_real=fopen(input,"r+b"))==NULL)
        goto error_corr;
    cc[11]=(cfunc( )/factor)*((float)(100.0/row));
    fclose(f_real);
```

APPENDIX-continued

```
        return;
error_corr:
        exitprogram(1,"UNABLE TO OPEN TEMPLATE FILE");
}
/* cfunc----------------------------------------------------------------------------------------*/
float cfunc( )
{
        float mnum=0.0,tr,ti;
        int x,y,i;
        union {
                float a[XSIZE] [YSIZE];
                float c[ASIZE];
        } c;
        memset(c.c,0,sizeof(c.c));
        fread(&c,filelength(f_real),1,f_real);
        i=0;
        switch (ALOOP) {
                case 2048 : for (y=0;y<nn[0];y++) {
                                for (x=0;x<(nn[0]*2);x+=2) {
                                        tr      = data.c[0] [y] [x]      * c.c[i] - data.c[0] [y] [x+1]    * c.c[i+1];
                                        ti      = data.c[0] [y] [x+1]    * c.c[i] + data.c[0] [y] [x]      * c.c[i+1];
                                        c.c[i]     = tr;
                                        c.c[i+1]   = ti;
                                                i+=2;
                                }
                        }
                        break;
                case 8192 : for (y=0;y<nn[0];y++) {
                                for (x=0;x<(nn[0]*2);x+=2) {
                                        tr      = data.a[y] [x]      * c.c[i] - data.a[y] [x+1]    * c.c[i+1];
                                        ti      = data.a[y] [x+1]    * c.c[i] + data.a[y] [x]      * c.c[i+1];
                                        c.c[i]     = tr;
                                        c.c[i+1]   = ti;
                                                i+=2;
                                }
                        }
                        break;
        }
/* inverse fft generates correlation function */
/* inverse fft of defect template */
        fourn(c.c-1,nn-1,DIMENSIONS,-1);
/* calculate maximum of correlation function */
        for (i=0;i<ALOOP;i+=2) {
                if (c.c[i]>mnum)
                        mnum=c.c[i];
        }
        return(mnum);
}
/* SWAP----------------------------------------------------------------------------------------*/
#define SWAP(a,b) tempr=(a);(a)=(b);(b)=tempr
/* fourn----------------------------------------------------------------------------------------*/
fourn(data,nn,ndim,isign)
float data[ ];
int nn[ ],ndim,isign;
{
int i1,i2,i3,i2rev,i3rev,ip1,ip2,ip3,ifp1,ifp2;
int ibit,idim,k1,k2,n,nprev,nrem,ntot;
float tempi,tempr;
double theta,wi,wpi,wpr,wr,wtemp;
ntot=1;
for (idim=1;idim<=ndim;idim++) ntot *= nn[idim];
nprev=1;
for (idim=ndim;idim>=1;idim--) {
        n=nn[idim];
        nrem=ntot/(n*nprev);
        ip1=nprev<<1;
        ip2=ip1*n;
        ip3=ip2*nrem;
        i2rev=1;
        for (i2=1;i2<=ip2;i2+=ip1) {
                if (i2 < i2rev) {
                        for (i1=i2;i1<=i2+ip1-2;i1+=2) {
                                for (i3=i1;i3<=ip3;i3+=ip2) {
                                        i3rev=i2rev+i3-i2;
                                        SWAP(data[i3],data[i3rev]);
                                        SWAP(data[i3+1],data[i3rev+1]);
                                }
                        }
                }
```

APPENDIX-continued

```
            ibit=ip2>>1;
            while (ibit >= ip1 && i2rev > ibit) {
                i2rev -= ibit;
                ibit >>= 1;
            }
            i2rev+=ibit;
        }
        ifp1=ip1;
        while (ifp1 < ip2) {
            ifp2=ifp1 <<1;
            theta=isign*6.28318530717959/(ifp2/ip1);
            wtemp=sin(0.5*theta);
            wpr = -2.0*wtemp*wtemp;
            wpi=sin(theta);
            wr=1.0;
            wi=0.0;
            for (i3=1;i3<=ifp1;i3+=ip1) {
                for (i1=i3;i1<=i3+ip1-2;i1+=2) {
                    for (i2=i1;i2<=ip3;i2+=ifp2) {
                        k1=i2;
                        k2=k1+ifp1;
                        tempr=wr*data[k2]-wi*data[k2+1];
                        tempi=wr*data[k2+1]+wi*data[k2];
                        data[k2]=data[k1]-tempr;
                        data[k2+1]=data[k1+1]-tempi;
                        data[k1]    += tempr;
                        data[k1+1]  += tempi;
                    }
                }
                wr=(wtemp=wr)*wpr-wi*wpi+wr;
                wi=wi*wpr+wtemp*wpi+wi;
            }
            ifp1=ifp2;
        }
        nprev*=n;
    }
}
/* detect-------------------------------------------------------------------------------*/
/* logical comparisons and pattern detection */
detect( ) {
    int i;
    if (cc[9] > 90) {
        wafer_data[wafer].total++;
        wafer_data[wafer].defect[0]=1;
        defects[0]++;
        sump[0]+=cc[9];
        sumsqrp[0]+=(cc[9]*cc[9]);
    }
    else {
        sumf[0]+=cc[9];
        sumsqrf[0]+=(cc[9]*cc[9]);
    }
    if (cc[10] > 75) {
        wafer_data[wafer].total++;
        wafer_data[wafer].defect[1]=1;
        defects[1]++;
        sump[1]+=cc[10];
        sumsqrp[1]+=(cc[10]*cc[10]);
    }
    else {
        sumf[1]+=cc[10];
        sumsqrf[1]+=(cc[10]*cc[10]);
    }
    if (cc[11] > 75) {
        wafer_data[wafer].total++;
        wafer_data[wafer].defect[2]=1;
        defects[2]++;
        sump[2]+=cc[11];
        sumsqrp[2]+=(cc[11]*cc[11]);
    }
    else {
        sumf[2]+=cc[11];
        sumsqrf[2]+=(cc[11]*cc[11]);
    }
    if (shade==1) {
        wafer_data[wafer].total++;
        wafer_data[wafer].defect[3]=1;
        defects[3]++;
        for (i=0;i<MAXSHADES;i++) {
```

APPENDIX-continued

```
            if (cc[i]>50) {
                wafer_data[wafer].total++;
                wafer_data[wafer].shade[i]=1;
            shades[i]++;
            sump[3]+=cc[i];
            sumsqrp[3]+=(cc[i]*cc[i]);
            }
            else {
                sumf[3]+=cc[i];
                sumsqrf[3]+=(cc[i]*cc[i]);
            }
        }
    }
}
```

What is claimed is:

1. An automated wafer yield and failure analysis system, comprising:

a wafer inspection instrument;

a data collection means coupled to said wafer inspection instrument for collecting wafer defect data from multiple defects on wafers from said wafer inspection instrument, said wafer defect data includes x, y and z coordinates;

a central database system having a means for storing wafer defect data coupled to receive said wafer defect data to compile a composite wafermap for each lot;

a conversion means coupled to the wafer inspection instrument for converting the collected wafer defect data from the wafer inspection instrument from an instrument specific format to a standard format, said conversion means uses a plurality of Fast Fourier Transform equations to convert the defect data;

said central database system having a means for storing converted wafer defect data patterns coupled to receive said converted wafer defect data patterns, wherein the stored converted wafer defect data patterns are retrievable based on selected criteria;

a means for comparing present wafer defect data to said stored converted wafer defect data patterns to generate correlation coefficients coupled to receive said wafer defect data and said stored converted wafer defect data, wherein the correlation coefficients identify the process associated with the die failure; said converted wafer defect data pattern is stored in said central database system when correlation coefficients are within a predetermined range; and at least one user interface workstation wherein user selected converted wafer defect data can be analyzed in real time to identify the associated malfunctioning equipment.

2. The system as in claim 1, wherein said first central database system comprises:

a server;

a first relational database installed on said server for organizing said composite wafer defect data in tables wherein said wafer defect data is summed for a wafer-lot;

a second relational database installed on said server for organizing said converted wafer defect data in tables;

a third relational data base installed on said server for organizing said converted wafer defect data patterns when said correlation coefficients are within a predetermined range; and wherein said means for storing composite wafer defect data and converted wafer defect data comprises a memory associated with said server to store said composite wafer defect data, said converted wafer defect data, and said tables.

3. The system as in claim 2, wherein said at least one interface workstation includes:

means for creating statistical graphical representations from said user selected composite wafer defect data; and means for displaying said representations coupled to receive said statistical graphical representations.

4. The system as in claim 1, further comprising:

a second central database system including,
a server,
a relational database installed on said server for organizing said converted wafer defect data in tables wherein said converted wafer defect data is tagged according to preselected criteria, and
wherein said means for composite wafer defect data comprises a memory associated with said server to store said composite wafer defect data and said tables.

5. The system as in claim 4, wherein said at least one interface workstation includes:

means for creating statistical graphical representations from said user selected converted wafer defect data; and means for displaying said representations coupled to receive said statistical graphical representations.

6. The system as in claim 3, further comprising:

at least one data analysis station having a means for analyzing said composite wafer defect data coupled to receive said user selected composite wafer defect data to analyze said composite wafer defect data;

a third central database system having means for storing composite wafer defect data pattern and analyzed composite wafer defect data coupled to receive said composite wafer defect data pattern and analyzed composite wafer defect data, wherein the stored composite wafer defect data patterns and analyzed composite wafer defect data are retrievable based on selected criteria;

a second conversion means coupled to the third central database system for converting the collected wafer defect data stored in the third central database system from an instrument specific format to a standard format, said second conversion means uses Fast Fourier Transform equations to convert said wafer defect data; and a means for transferring said composite wafer defect data pattern and said analyzed wafer defect data to said second central database system.

7. The system as in claim 6, wherein said at least one data analysis station includes a means for creating statistical and graphical representations.

8. The system as in claim 7, wherein said means for creating said statistical and graphical representations is independent of said third central database system.

9. The system as in claim 8, wherein said means for creating said statistical and graphical representations includes a point-and-click graphical interface system allowing said user selected analyzed data to be selectively displayed in at least one format selected from the group consisting of a trend chart, an image, a wafer map, a tool comparison, or a Pareto chart.

10. The system as in claim 1, wherein said selected criteria includes process technology, layer, lot, wafer, device, process equipment identification, and scan tool identification.

11. A method for generating failure and yield analysis for composite wafermaps, comprising the steps of:

collecting wafer defect data from multiple defects on wafers from a wafer inspection instrument;

storing the wafer defect data from the wafer inspection instrument in a first central database system to form composite wafermaps for each lot;

converting wafer defect data into Fast Fourier Transform signatures;

storing the converted wafer defect data from the wafer inspection instrument in a second central database;

comparing wafer defect data with data previously stored in said second central database;

generating correlation coefficients from the comparison of present wafer defect data to past wafer defect data, wherein the correlation coefficients identify the process associated with the die failure;

transferring wafer defect data on to at least one user interface workstation;

analyzing wafer defect data to identify the associated malfunctioning equipment; and displaying wafer defect data on to at least one user interface workstation.

12. The method of claim 11, further comprising the step of organizing said composite wafer defect data in tables in a relational database installed on a server in said first central database system wherein said composite wafer defect data is tagged according to preselected criteria comprising process technology, layer, lot, wafer, device process equipment identification, and scan tool identification.

13. The method of claim 12, further comprising the steps of creating statistical and graphical representations from said user selected composite wafer defect data; and displaying said representations at said user interface workstation in a format selected from the group consisting of a trend chart, an image, a wafer map, a tool comparison, or a pareto chart.

* * * * *